(12) United States Patent
Platzgummer et al.

(10) Patent No.: US 9,093,201 B2
(45) Date of Patent: Jul. 28, 2015

(54) HIGH-VOLTAGE INSULATION DEVICE FOR CHARGED-PARTICLE OPTICAL APPARATUS

(71) Applicant: IMS NANOFABRICATION AG, Vienna (AT)

(72) Inventors: Elmar Platzgummer, Vienna (AT); Andreas Chylik, Schrems (AT); Gerald Kratzert, Perchtoldsdorf (AT); Roman Oberleitner, Vienna (AT)

(73) Assignee: IMS NANOFABRICATION AG, Vienna (AT)

( * ) Notice: Subject to any disclaimer, the term of this patent is extended or adjusted under 35 U.S.C. 154(b) by 68 days.

(21) Appl. No.: 14/155,771

(22) Filed: Jan. 15, 2014

(65) Prior Publication Data
US 2014/0197327 A1    Jul. 17, 2014

(30) Foreign Application Priority Data

Jan. 17, 2013 (EP) .................................... 13151585

(51) Int. Cl.
| | |
|---|---|
| *H01J 1/90* | (2006.01) |
| *H01B 17/14* | (2006.01) |
| *H01J 37/147* | (2006.01) |
| *H01J 37/02* | (2006.01) |

(Continued)

(52) U.S. Cl.
CPC ............... *H01B 17/14* (2013.01); *B82Y 10/00* (2013.01); *B82Y 40/00* (2013.01); *H01J 37/023* (2013.01); *H01J 37/04* (2013.01); *H01J 37/147* (2013.01); *H01J 37/15* (2013.01); *H01J 37/3177* (2013.01); *H01J 2237/036* (2013.01); *H01J 2237/038* (2013.01); *H01J 2237/1502* (2013.01)

(58) Field of Classification Search
None
See application file for complete search history.

(56) References Cited

U.S. PATENT DOCUMENTS 1,033,741 A * 7/1912 Sims ............................. 152/174
1,420,104 A * 6/1922 Howe ............................. 408/90
(Continued)

FOREIGN PATENT DOCUMENTS

| CN | 202204836 U | 4/2012 |
|---|---|---|
| EP | 1033741 A2 | 9/2000 |

(Continued)

OTHER PUBLICATIONS

European Search Report for Application 141501197.7, dated Jun. 6, 2014, 2 pgs.

(Continued)

*Primary Examiner* — Andrew Smyth
(74) *Attorney, Agent, or Firm* — KPPB LLP

(57) ABSTRACT

A high-voltage insulation device (300) for use in a charged-particle optical apparatus comprises a plurality of rigid pillars (320) made of electrically insulating material. These pillars (320) are arranged around a central passage (310) which traverses the insulating device along its longitudinal axis (L), and the two ends of each pillar are configured to be respectively fixed to two separate electrostatic housings (221, 231) of the charged-particle optical apparatus by means of two respective end plates (311, 312), with the pillars (320) being oriented at an angle so as to be inclined with regard to said longitudinal axis (L). Advantageously, the pillars are mechanically adjustable with regard to their effective length, and each pillar (320) is arranged outside the central passage with its two ends at either of the first and second end plates (311, 312), preferably in a zig-zag arrangement.

16 Claims, 5 Drawing Sheets

(51) Int. Cl.
 *H01J 37/04* (2006.01)
 *H01J 37/15* (2006.01)
 *H01J 37/317* (2006.01)
 *B82Y 10/00* (2011.01)
 *B82Y 40/00* (2011.01)

(56) References Cited

U.S. PATENT DOCUMENTS

| | | | | |
|---|---|---|---|---|
| 1,903,005 | A * | 3/1933 | McCuen | 184/6.24 |
| 2,187,427 | A * | 1/1940 | Middleton | 337/195 |
| 2,820,109 | A * | 1/1958 | Dewitz | 330/8 |
| 2,920,104 | A * | 1/1960 | Brooks et al. | 562/27 |
| 3,949,265 | A * | 4/1976 | Holl | 315/15 |
| 4,735,881 | A * | 4/1988 | Kobayashi et al. | 430/30 |
| 5,103,101 | A * | 4/1992 | Berglund et al. | 250/492.2 |
| 5,260,579 | A * | 11/1993 | Yasuda et al. | 250/492.2 |
| 5,369,282 | A * | 11/1994 | Arai et al. | 250/492.22 |
| 5,399,872 | A * | 3/1995 | Yasuda et al. | 250/492.22 |
| 5,814,423 | A * | 9/1998 | Maruyama et al. | 430/5 |
| 5,841,145 | A * | 11/1998 | Satoh et al. | 250/492.22 |
| 5,857,815 | A * | 1/1999 | Bailey et al. | 409/201 |
| 5,876,902 | A * | 3/1999 | Veneklasen et al. | 430/296 |
| 6,014,200 | A * | 1/2000 | Sogard et al. | 355/53 |
| 6,043,496 | A * | 3/2000 | Tennant | 250/492.1 |
| 6,049,085 | A * | 4/2000 | Ema | 250/492.22 |
| 6,111,932 | A * | 8/2000 | Dinsmore | 378/136 |
| 6,137,113 | A * | 10/2000 | Muraki | 250/492.22 |
| 6,225,637 | B1 * | 5/2001 | Terashima et al. | 250/492.2 |
| 6,229,595 | B1 * | 5/2001 | McKinley et al. | 355/53 |
| 6,252,339 | B1 * | 6/2001 | Kendall | 313/237 |
| 6,280,798 | B1 * | 8/2001 | Ring et al. | 427/459 |
| 6,333,138 | B1 * | 12/2001 | Higashikawa et al. | 430/296 |
| 6,473,237 | B2 * | 10/2002 | Mei | 359/619 |
| 6,768,123 | B2 * | 7/2004 | Giering | 250/458.1 |
| 6,768,125 | B2 * | 7/2004 | Platzgummer et al. | 250/492.22 |
| 6,858,118 | B2 * | 2/2005 | Platzgummer et al. | 204/298.04 |
| 6,965,153 | B1 * | 11/2005 | Ono et al. | 257/448 |
| 7,084,411 | B2 * | 8/2006 | Lammer-Pachlinger et al. | 250/492.1 |
| 7,124,660 | B2 * | 10/2006 | Chiang | 74/490.05 |
| 7,129,024 | B2 * | 10/2006 | Ki | 430/296 |
| 7,201,213 | B2 * | 4/2007 | Leeson et al. | 165/44 |
| 7,214,951 | B2 * | 5/2007 | Stengl et al. | 250/492.23 |
| 7,276,714 | B2 * | 10/2007 | Platzgummer et al. | 250/492.22 |
| 7,459,247 | B2 * | 12/2008 | Bijnen et al. | 430/22 |
| 7,687,783 | B2 * | 3/2010 | Platzgummer et al. | 250/396 R |
| 7,710,634 | B2 * | 5/2010 | Sandstrom | 359/290 |
| 7,714,298 | B2 * | 5/2010 | Platzgummer | 250/396 R |
| 7,781,748 | B2 * | 8/2010 | Platzgummer | 250/492.22 |
| 7,823,081 | B2 * | 10/2010 | Sato | 715/810 |
| 8,057,972 | B2 * | 11/2011 | Fragner et al. | 430/30 |
| 8,183,543 | B2 * | 5/2012 | Platzgummer | 250/492.2 |
| 8,198,601 | B2 * | 6/2012 | Platzgummer et al. | 250/396 R |
| 8,222,621 | B2 * | 7/2012 | Fragner et al. | 250/492.22 |
| 8,227,768 | B2 * | 7/2012 | Smick et al. | 250/491.1 |
| 8,294,117 | B2 * | 10/2012 | Kruit et al. | 250/396 R |
| 8,378,320 | B2 * | 2/2013 | Platzgummer | 250/492.22 |
| 8,546,767 | B2 * | 10/2013 | Platzgummer | 250/396 R |
| 8,563,942 | B2 * | 10/2013 | Platzgummer | 250/396 R |
| 2002/0021426 | A1 * | 2/2002 | Mei et al. | 355/53 |
| 2003/0085360 | A1 * | 5/2003 | Parker et al. | 250/396 R |
| 2003/0106230 | A1 * | 6/2003 | Hennessey | 33/645 |
| 2003/0155534 | A1 * | 8/2003 | Platzgummer et al. | 250/492.22 |
| 2004/0058536 | A1 * | 3/2004 | Ki | 438/689 |
| 2004/0119021 | A1 * | 6/2004 | Parker et al. | 250/396 R |
| 2004/0157407 | A1 * | 8/2004 | Tong et al. | 438/455 |
| 2004/0169147 | A1 * | 9/2004 | Ono et al. | 250/396 R |
| 2005/0063510 | A1 * | 3/2005 | Hieronimi et al. | 378/65 |
| 2005/0242302 | A1 * | 11/2005 | Platzgummer et al. | 250/492.22 |
| 2005/0242303 | A1 * | 11/2005 | Platzgummer | 250/492.22 |
| 2006/0076509 | A1 * | 4/2006 | Okino et al. | 250/492.2 |
| 2006/0169925 | A1 * | 8/2006 | Miyajima et al. | 250/492.22 |
| 2007/0138374 | A1 * | 6/2007 | Nishibashi et al. | 250/208.1 |
| 2007/0279768 | A1 * | 12/2007 | Shibazaki | 359/811 |
| 2008/0105827 | A1 * | 5/2008 | Tamamushi | 250/396 R |
| 2008/0128638 | A1 * | 6/2008 | Doering et al. | 250/492.2 |
| 2008/0142728 | A1 * | 6/2008 | Smick et al. | 250/400 |
| 2008/0198352 | A1 * | 8/2008 | Kugler et al. | 355/66 |
| 2008/0203317 | A1 * | 8/2008 | Platzgummer et al. | 250/396 R |
| 2008/0237460 | A1 * | 10/2008 | Fragner et al. | 250/307 |
| 2008/0257096 | A1 * | 10/2008 | Zhu et al. | 74/490.08 |
| 2008/0283767 | A1 * | 11/2008 | Platzgummer | 250/396 R |
| 2008/0299490 | A1 * | 12/2008 | Takekoshi | 430/296 |
| 2009/0032700 | A1 * | 2/2009 | Park et al. | 250/282 |
| 2009/0101816 | A1 * | 4/2009 | Noji et al. | 250/310 |
| 2009/0256075 | A1 * | 10/2009 | Kemen et al. | 250/307 |
| 2009/0321631 | A1 * | 12/2009 | Smick et al. | 250/282 |
| 2010/0127185 | A1 * | 5/2010 | Fragner et al. | 250/398 |
| 2010/0288938 | A1 * | 11/2010 | Platzgummer | 250/396 R |
| 2011/0053087 | A1 | 3/2011 | Nielsen et al. | |
| 2011/0204253 | A1 * | 8/2011 | Platzgummer et al. | 250/396 R |
| 2011/0226968 | A1 * | 9/2011 | Platzgummer | 250/492.3 |
| 2012/0076269 | A1 * | 3/2012 | Roberts | 378/65 |
| 2012/0085940 | A1 * | 4/2012 | Matsumoto | 250/492.3 |
| 2012/0211674 | A1 * | 8/2012 | Kato | 250/492.3 |
| 2012/0286170 | A1 * | 11/2012 | Van De Peut et al. | 250/397 |
| 2013/0164684 | A1 * | 6/2013 | Yamanaka | 430/296 |
| 2015/0021493 | A1 * | 1/2015 | Platzgummer, Elmar | 250/396 R |
| 2015/0028230 | A1 * | 1/2015 | Platzgummer, Elmar | 250/492.3 |

FOREIGN PATENT DOCUMENTS

| | | | | |
|---|---|---|---|---|
| EP | 2187427 | A2 | 5/2010 | |
| JP | 08213301 | A | 8/1996 | |
| JP | 2006019436 | A | 1/2006 | |
| JP | 2006332289 | A | 12/2006 | |
| WO | WO 2008053140 | A1 * | 5/2008 | H01J 37/20 |
| WO | 2009147202 | A1 | 12/2009 | |
| WO | 2012172913 | A1 | 12/2012 | |

OTHER PUBLICATIONS

European Search Report for EP 14176645, completed Dec. 1, 2014, 1 pg.
European Search Report for Application No. 09450211.9-1226, Report Dated Sep. 14, 2010, 4 pages.
European Search Report for Application No. 09450212.7, Report Dated Sep. 28, 2010, 9 pages.
European Search Report for Application No. 14177851; Report Dated Oct. 16, 2014; 1 page.
European Search Report for Application No. 08450077.6, Report Dated Jan. 29, 2010, 4 pages.
European Search Report for Application No. 10450070.7, Report Dated May 7, 2012, 13 pgs.
Berry et al., "Programmable Aperture Plate for Maskless High-Throughput Nanolithography", J. Vac. Sci. Technol., Nov./Dec. 1997, vol. B15, No. 6, pp. 2382-2386.
Disclosed Anonymously, "Multi-Tone Rasterization, Dual Pass Scan, Data Path and Cell Based Vector Format", IPCOM000183472D, printed from ip.com PriorArtDatabase, published May 22, 2009, 108 pages.
Kapl et al., "Characterization of CMOS Programmable Multi-Beam Blanking Arrays as Used for Programmable Multi-Beam Projection Lithography and Reisitless Nanopatterning", Journal of Micromechanics and Microengineering, 21 (2001), pp. 1-8.
Platzgummer et al., "eMET—50keV Electron Mask Exposure Tool Development Based on Proven Multi-Beam Projection Technology", Proc. of SPIE, vol. 7823, pp. 782308-1-782308-12, 2010.
Zhang et al., "Integrated Multi-Electron-Beam Blanker Array for Sub-10-nm Electron Beam Induced Deposition", J. Vac. Sci. Technol., Nov./Dec. 2006, vol. B24, No. 6, pp. 2857-2860.

* cited by examiner

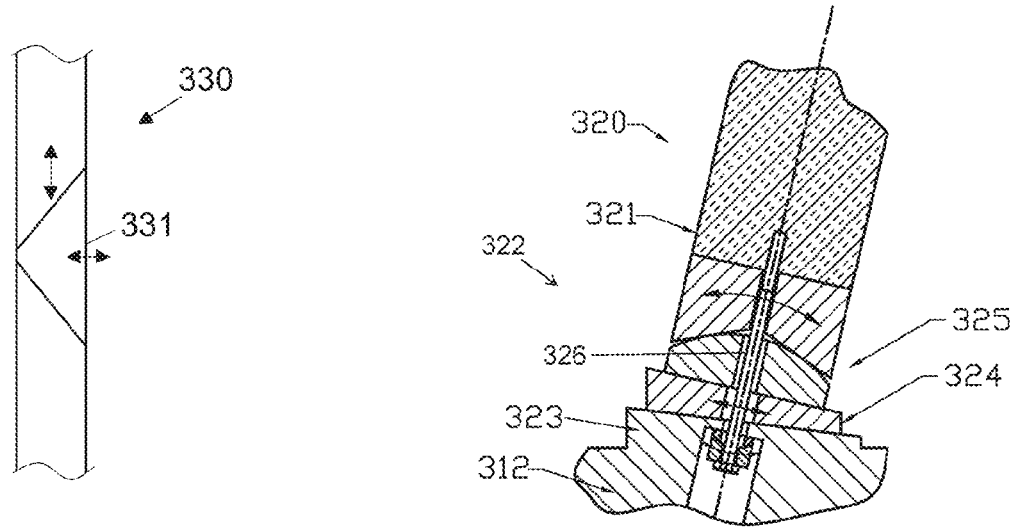
Fig. 6
Fig. 4
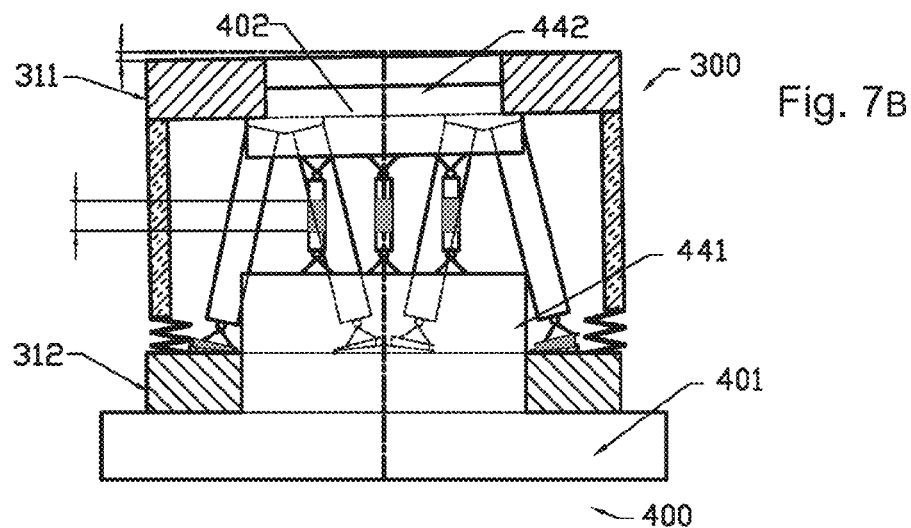
Fig. 7B
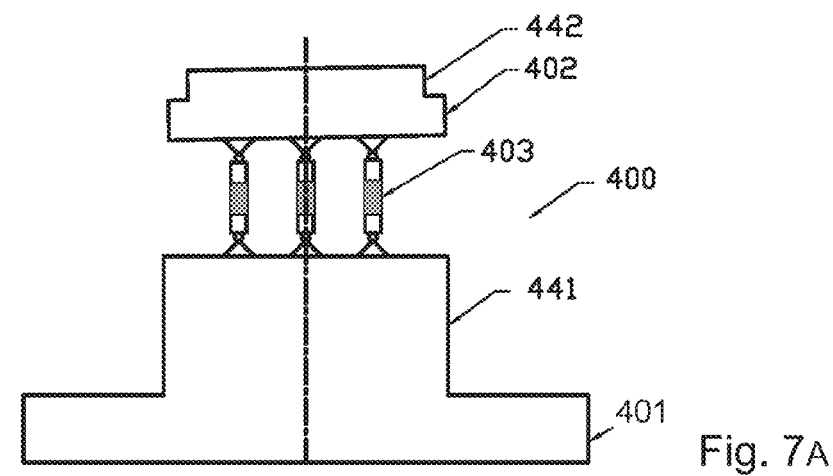
Fig. 7A

HIGH-VOLTAGE INSULATION DEVICE FOR CHARGED-PARTICLE OPTICAL APPARATUS

CROSS-REFERENCE TO RELATED APPLICATIONS

This application claims the benefit of European Patent Application No. 13151585.0, filed Jan. 17, 2013, the disclosure of which is hereby incorporated by reference as if set forth in full herein.

FIELD OF THE INVENTION

The present invention relates to a high-voltage insulation device for use in a charged-particle optical apparatus, comprising a construction of electrically insulating material. Furthermore, the invention relates to a charged-particle optical apparatus comprising an electro-optical column and at least two electrostatic housings which surround respective sections of the electro-optical column and are configured for being applied different electrostatic potentials. The high-voltage insulating device is configured for separating two electrostatic housings of the mentioned kind.

BACKGROUND

In a charged-particle optical apparatus of the mentioned kind charged particles such as electrons or ions are brought to high kinetic energies, by means of an electro-optical column employing electrostatic high voltages in the range of several kilovolts (kV), and projected onto a target in order to perform certain structuring processes such as CVD processes, electron-based structuring of the target surface and exposure of a resist-layer in order to form a mask for subsequent etching processes. The high voltages used in these apparatuses have to be safely confined so as to avoid electric hazards to the operating personnel as well as surrounding devices. At the same time, it is required to keep the components of the electro-optical column, which includes parts operated at high and low voltages, stably at their respective positions with small tolerances of mutual alignment.

A conventional approach is to keep the entire electro-optical column within one electrostatic housing kept a ground potential (or zero potential, 0 V). For such a setup, it is necessary to provide for high-voltage feedthroughs for the high-voltage supply lines that are used to for high-voltage components, which are bulky and expensive.

Another approach is to employ a high-voltage housing which encases the high-voltage section of the electro-optical column. Then, the insulation between the high-voltage housing and the rest of the electro-optical column at low voltages has to be realized as a rigid device in order to provide for both electric insulation and rigid mechanical connection. However, conventional insulating devices envisaged a massive insulating ring, which involves high mass and costs, has high risk of breakage and is difficult to adjust with regard to the position of high-voltage and low-voltage sections.

SUMMARY OF THE INVENTION

It is an aim of the invention to provide a high-voltage insulation device which ensures high mechanical stability and good electrical insulation while at the same time allowing for mechanical adjustment of the height and orientation of the device. In addition, it is desired that the device has low weight while allowing a simple assembling procedure.

This aim is achieved by a high-voltage insulation device for use in a charged-particle optical apparatus, which comprises a plurality of rigid pillars made of electrically insulating material; these pillars are arranged around a central passage which traverses the insulating device along its longitudinal axis, and the two ends of each pillar are configured to be respectively fixed to two separate electrostatic housings of the charged-particle optical apparatus by means of two respective end plates, with the pillars being oriented at an (inclined) angle with regard to said longitudinal axis. In an advantageous development, the insulating device further includes the mentioned first and second end plates, and the central passage runs between central openings of the first and second end plates; each pillar is arranged outside the central passage with its two ends at either of the first and second end plates (i.e., the first end of the pillar is fixed at the first end plate and its second end at the second end plate).

By virtue of this solution the mentioned aim is achieved with a setup which ensures high mechanical stability and good insulation properties against high voltages, yet is surprisingly simple to mount and maintain. In particular, it allows the relative positional adjustment between the upper and lower section of the electro-optical column and correction of misalignment which may arise due to production tolerances.

Advantageously, the first and second end plates may be realized as planar plates oriented parallel to each other and having the same overall circular cylindrical shape around the longitudinal axis; also, the respective central openings will preferably circular and centered around the longitudinal axis. Such circular symmetry of the insulating device helps to reduce unwanted electromagnetic influences on the electro-optical column traversing the insulating device.

In a preferred aspect of the invention, the pillars are provided with adjustment means allowing mechanical adjustment of an effective length of the pillars, so as to provide an adjustment of the height of the insulator device as measured along the longitudinal axis. In order to facilitate adjusting a length of a pillar, at least one end of the respective pillar may be provided with an adjustable jack. In addition, the end of the pillar may preferably be provided with a joint allowing for a correction of an angle of tilt of the pillar with respect to the longitudinal axis.

In a suitable specific implementation of the invention, each pillar is oriented to the longitudinal axis in a skew line arrangement at an angle of tilt, with the ends of each pillar located at a greater distance to the longitudinal axis than a central portion of the pillar. The skewed arrangement allows a high flexibility of the setup, similar to a construction with diagonal struts. In particular, the pillars may be arranged in a configuration of alternating angles of tilt with regard to the longitudinal axis. This realizes a zig-zag arrangement (or "crown" configuration) which unites high stability with ease of adjustment.

Furthermore, it is advantageous when the pillars are arranged around the central passage at regular angular intervals. Suitably, the pillars, more specifically their bodies of electrically insulating material, may be made in a single piece.

The aim mentioned above is likewise met by a charged-particle optical apparatus of the kind as mentioned in the beginning, incorporating the insulating device according to the invention. Furthermore, in such apparatus the high-voltage insulating device will connect an end plate (the "first" end plate) of one of the electrostatic housings with an end plate (the "second" end plate) of a second electrostatic housing; the end plates comprise openings configured to be combined with the central openings of the high-voltage insulating device so as to form a channel for the electro-optical column.

According to a further advantageous aspect of the invention, the insulating device is configured to be positioned within a high-vacuum space dedicated to an electro-optical column oriented along the central opening. Furthermore, in the case where the electro-optical column of the charged-particle optical apparatus is to be contained within a high-vacuum space, the pillars will suitably be positioned within said high-vacuum space. In this context, the insulation device may include a vacuum housing, which surrounds the pillars and the central passage, of generally tubular shape; in order to be able to adapt to length variations, the vacuum housing may suitably comprise a length-adjustable segment, preferably a bellows segment. In addition, the charged-particle optical apparatus may include a vacuum casing connecting the first and second end plates and surrounding the plurality of pillars of the insulating device, with the vacuum casing further comprising a vacuum-tight insulating ring which is of tubular shape and arranged between the first end second end plates.

Further developments and advantageous aspects of the invention will be set forth with an exemplary embodiment given hereinafter.

BRIEF DESCRIPTION OF THE DRAWINGS

In the following, the present invention is described in more detail with reference to the drawings, which show schematic illustrations of an embodiment of the invention:

FIG. 4 shows a detail of the insulating device of FIGS. 3A to 3C, illustrating the connecting assembly of a lower end of one pillar to the bottom end plate;

FIG. 6 illustrates one way of length adjustment of the ferrite insulators; and

FIG. 7A shows a prop device for the assembly of the insulating device, and

FIG. 7B illustrates the assembly of the insulating device using the prop device of FIG. 7A.

DETAILED DESCRIPTION OF THE INVENTION

Figure 1:
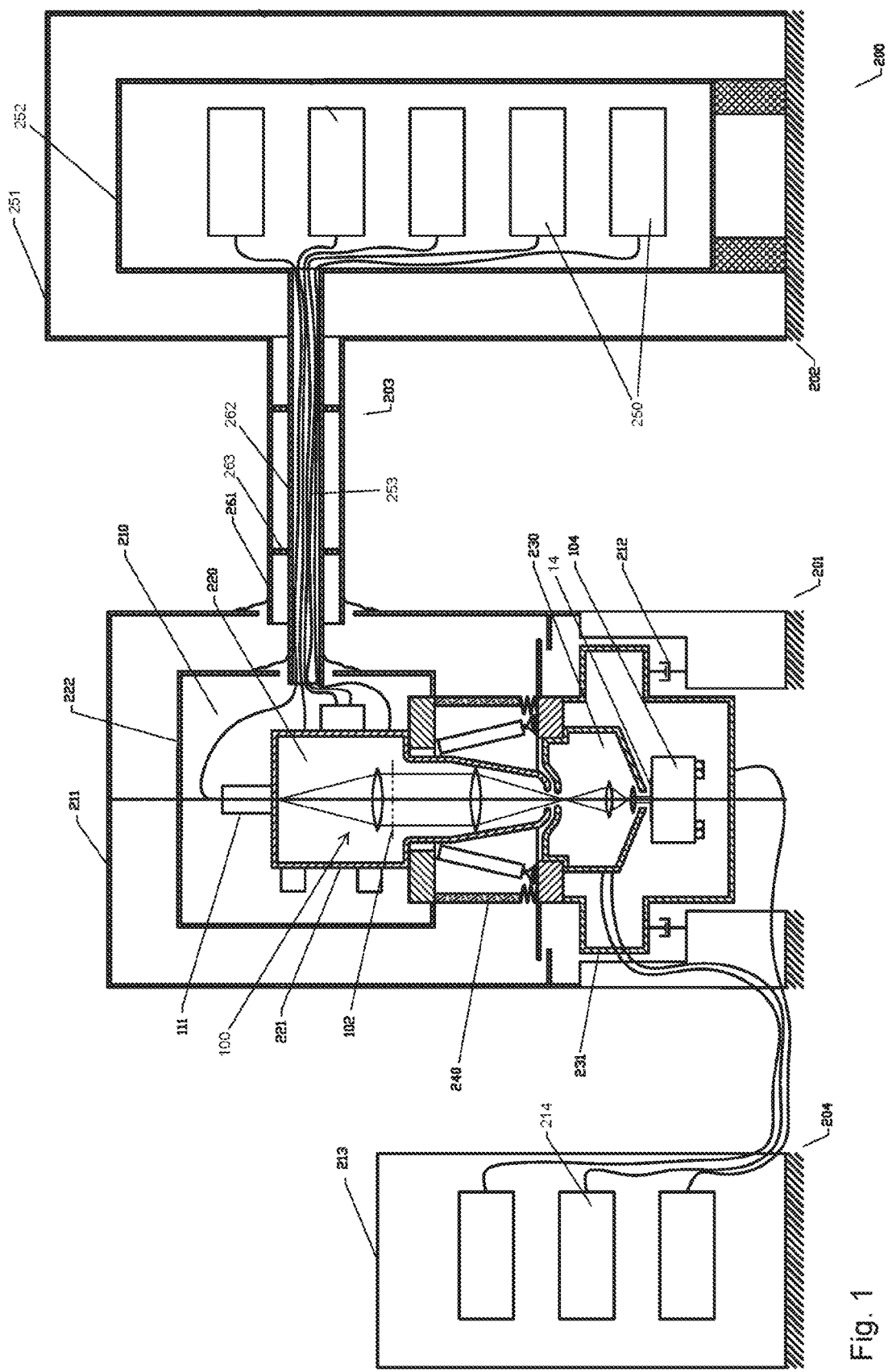
FIG. 1 shows a tool setup according to the embodiment of the invention in a sectional view.
Figure 2:
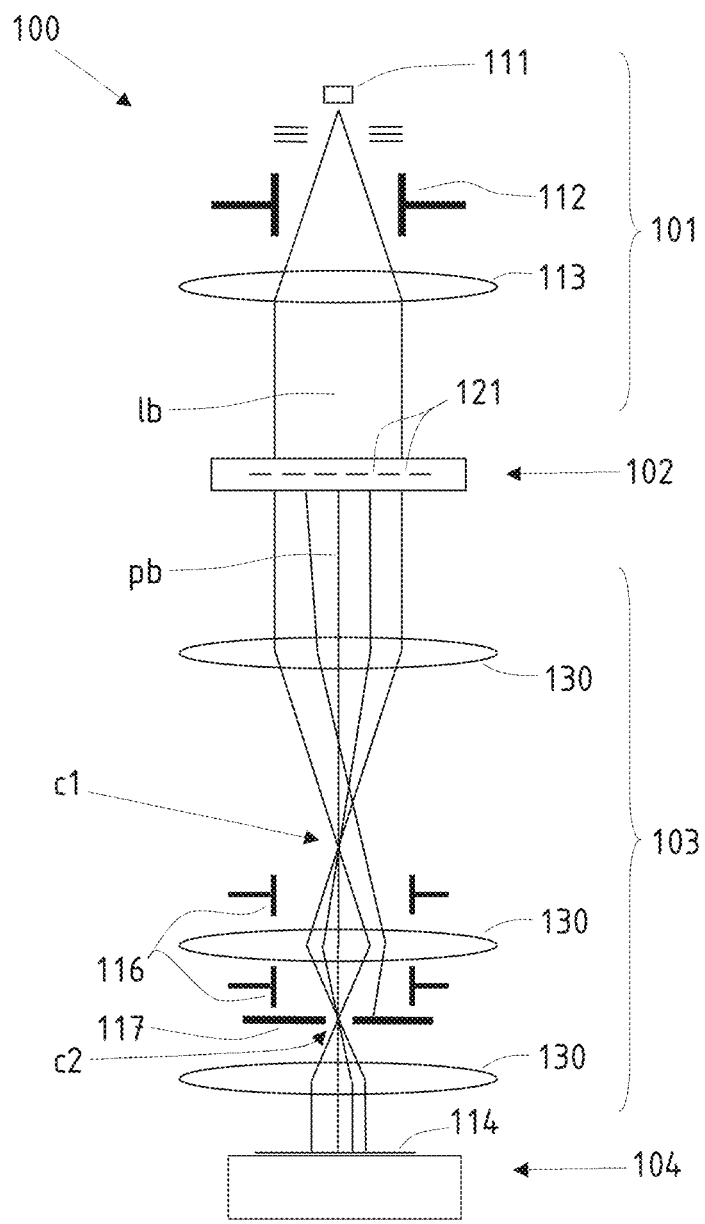
FIG. 2 shows the optical column of the tool setup of FIG. 1 in a longitudinal sectional view.

FIG. 1 shows a particle-beam-based processing tool according to the invention, comprising an optical column; the optical column is shown in greater detail in FIG. 2. The preferred embodiment of the invention discussed in the following implements a particle-beam exposure apparatus of the type referred to as PML2. The PML2 architecture includes a pattern definition (PD) system defining the structures to be exposed/processed at the target, and a large-reduction projecting system. It is to be appreciated that the invention is not restricted to the following embodiments or the particular layout of PD systems, which merely represent examples of possible implementations of the invention; rather, the invention is suitable for other types of processing systems that employ a particle-beam and projection of the features of a PD system onto a target to be processed.

The schematic sectional view shown in FIG. 1 depicts an overview of the architecture of the tool setup 200 according to the embodiment of the invention. The assembly in the center of FIG. 1 represents the electro-optical assembly 201 containing the electro-optical apparatus 210 proper, which contains the particle-beam-based processing system including an optical column 100 and a wafer stage 104, as well as the surrounding structure to ensure the mechanical and electric stability of the system, including housings and various structural components. The assembly in the right-hand part of FIG. 1 is a high-voltage supply setup 202 for the electric voltages feeding a high-voltage section 220 of the apparatus 210. In the left-hand part of FIG. 1 a low-voltage supply setup 204 is shown. Since most of the components will be generally familiar to the person skilled in the art, only those components which illustrate the main components of the setup and the invention are shown and discussed hereinafter.

PML2 System

Referring to FIG. 2, the optical column 100 implements the architecture of a maskless particle-beam processing apparatus PML2. In the following, only those details are given as needed to disclose the invention; for the sake of clarity, the components are not shown to size in FIG. 2, particularly the lateral width of the particle beam is exaggerated. In the PML2 layout the PD system is realized as a maskless system including a plurality of apertures which can be selectively modified so to be imaged onto the target, or projected out so as to not reach the target. For more details, the reader is referred to patent documents U.S. Pat. Nos. 6,768,125 and 7,781,748 of the applicant, whose teachings with respect to the overall layout of the particle-beam apparatus and the PD means are herewith incorporated by reference.

The particle beam employed in the apparatus is generated by a particle source; then, an illumination optical system forms the beam into a wide beam which illuminates a PD means having a regular array of apertures in order to define a beam pattern to be projected on a target surface. With each aperture, a small beam (also referred to as 'beamlet') is defined, and the passage of each beam through an aperture can be controlled so as to allow ('switch on') or effectively deactivate ('switch off') the passage of particles of the beam through the respective apertures towards the target. The beam permeating the aperture array forms a patterned particle beam bearing pattern information as represented by the spatial arrangement of the apertures. The patterned beam is then projected by means of a particle-optical projection system onto the target (for instance, a semiconductor substrate) where an image of the apertures is thus formed to modify the target at the irradiated portions. The image formed by the beam is moved along a predetermined path over the die fields of the target.

More in detail, the main components of the optical column 100 are—in the order of the propagation direction of the lithography beam lb, pb which in this example runs vertically downward in FIG. 2—an illumination system 101, a PD system 102, and a projecting system 103. Furthermore, a target station 104 with the target or substrate 114 is provided. The particle-optical systems 101, 103 are realized using electrostatic or electromagnetic lenses. The electro-optical sections 101, 102, 103 of the column 100 are contained in a vacuum housing (see FIG. 1) held at high vacuum to ensure an unimpeded propagation of the beam lb, pb along the optical axis of the apparatus.

The illumination system 101 comprises, for instance, a particle source 111, an extractor arrangement defining the location of the virtual source, a particle filter/general blanker 112 and an illumination optics realized by a condenser lens system 113. The charge particles used can be, for instance, hydrogen ions or heavy ions; in the context of this disclosure heavy ions refer to ions of elements heavier than C, such as O, N, or the noble gases Ne, Ar, Kr, Xe. Apart from ions, the particles can be electrons (emitted from an electron gun) or, in general, other electrically charged particles can be used as well.

The particle source 111 emits energetic ions, or more generally charged particles, of primarily a certain species having a defined (kinetic) energy of typically several keV (e.g. hydrogen ions at 5 keV at the PD system 102) with a comparatively small energy spread of, e.g., below ΔE=1 eV. A velocity/energy dependent filter 112 serves to filter out other, unwanted particle species that may also be produced in the source 111; the filter 112 may also be used to blank out the beam as a whole during repositioning of the beamlets. By means of an electro-optical condenser lens system 113, the charged particles emitted from the source 111 are formed into a wide-area, substantially telecentric ion beam serving as lithography beam lb.

The lithography beam lb then irradiates a PD device which, together with the devices needed to keep its position, forms the PD system 102. The PD device is held at a specific position in the path of the lithography beam lb, which thus irradiates an aperture pattern formed by a plurality of apertures 121. As already mentioned, each of the apertures can be "switched on" or "open" so as to allow the beamlet passing through the respective aperture to reach the target; it is then said, the aperture is transparent to the incident beam. Otherwise, the aperture is "switched off" or "closed", in which case the beam path of the respective beamlet is affected in a way that it will be absorbed or otherwise removed out of the beam path before it can reach the target; thus, the aperture is effectively non-transparent or opaque to the beam. The pattern of switched-on apertures is chosen according to the pattern to be exposed on the substrate, as these apertures are the only portions of the PD device transparent to the beam lb, which is thus formed into a patterned beam pb emerging from the apertures (i.e., in FIG. 2, below the PD system 102). The architecture and operation of the PD device, in particular with regard to its blanking plate, is discussed in detail below. In FIG. 2 only five beamlets are shown in the patterned beam pb, while it will be clear that the actual number of beamlets is very large. Of the beamlets shown, the second from the left is depicted switched off as it is absorbed on an absorbing plate 117; the other beamlets, which are switched-on, pass through a central opening of the plate 117 and thus are projected onto the target.

The pattern as represented by the patterned beam pb is then projected by means of an electro-optical projection system 103 onto the substrate 114 where it forms an image of the switched-on mask apertures. The projection system 103 implements a demagnification of, for instance, 200x. The substrate 114 is, for instance, a silicon wafer covered with a photo-resist layer. The wafer 114 is held and positioned by a wafer stage (not shown) of the target station 104. A detector 115 for secondary radiation can be used to detect the proper positioning of the substrate with respect to the beam.

The projection system 103 is, for instance, composed of two consecutive electro-optical projector stages with a crossover c1, c2, respectively. The electrostatic lenses 130 used to realize the projectors are shown in FIG. 2 in symbolic form only as technical realizations of electrostatic imaging systems are well known in the prior art; in other embodiments of the invention, also magnetic and/or electromagnetic lenses may be included as suitable. The first projector stage images the plane of the apertures of the PD device to an intermediate image which in turn is imaged onto the substrate surface by means of the second projector stage. Both stages employ a demagnifying imaging through crossovers c1, c2; thus, while the intermediate image is inverted, the final image produced on the substrate is upright (non-inverted). A demagnification of the order of 200 is in particular suitable with a lithography setup, in order to elevate problems of miniaturization in the PD device. The electrooptical lenses are mainly composed of electrostatic electrodes, but magnetic lenses may also be used.

As a means to introduce a small lateral shift to the image, i.e. along a direction perpendicular to the optical axis cx, deflection means 116 are provided in one or both of the projector stages. Additionally, a magnetic coil may be used to generate a rotation of the pattern in the substrate plane where needed. The lateral deflections are usually quite small in comparison to the lateral width of the patterned beam pb itself, in most cases in the order of a few widths of a single beamlet or the distance between neighboring beamlets, but still at least one order of magnitudes below the beam width (it should be appreciated in this context that the lateral distance between beamlets is considerably smaller than the entire width of the beam pb).

By controlling the pattern formed in the PD system 102, an arbitrary beam pattern can be generated and transferred to a substrate. Suitably, a scanning stripe exposure strategy, where the substrate is moved under the incident beam, is utilized so a beam-scanning strategy is not required, where the position of the beam is perpetually changed and thus the beam is effectively scanned over the target surface (which is at rest or only slowly moved, with a far smaller velocity) like in case of a single focused beam system. Details of the exposure strategy can be found in the already-mentioned prior art, in particular the U.S. Pat. No. 7,781,748 mentioned above.

Apparatus Architecture

Referring again to FIG. 1, the apparatus 210 comprises a high-voltage section 220 and a low-voltage section 230; each section is housed in a respective section housing 221, 231 made of a metal, such as steel or aluminum, which provides both mechanical stability of the enclosed components and electrical enclosure. The section housings 221, 231 define a common space in which the electrooptical column 100 (FIG. 2) of the apparatus 210 is contained. This space is held at vacuum conditions by means of vacuum pumps (not shown) connected to the housings; suitable vacuum pumps and vacuum connections are known from prior art. A typical vacuum pressure for a particle optical device is about $1 \cdot 10^{-6}$ mbar ($1 \cdot 10^{-4}$ Pa). The high-voltage section 220 comprises, for instance, the complete illumination system 101, the PD system 102, and a part of the projecting system 103, namely, until approximately the place where the first crossover c1 is formed. The remaining part of the projecting system 103 and the target station 104 belong to the low-voltage section 230 and are, thus, located in the low-voltage section housing 231.

The high-voltage section housing 221 (more precisely, its head part corresponding to the upstream-part of the high-voltage section 220) is contained within a high-voltage shielding 222 serving as a safety envelope, for instance realized as an enveloping metal grid mounted on a frame with softened edges, so as to form an electrically conducting smooth outer surface in order to homogenize the relative outer electric field and avoid field concentration which might be caused by highly curved regions of the surface, which in turn may cause sparks and discharge effects. The high-voltage section and its housing 221 protrude at its downstream part (i.e., the part opposite to the source) into an insulator device 240 which is mounted, at one side, in an opening of the safety envelope 222. The other side of the insulator device 240 is connected with the low-voltage section housing 230. The insulator device 240 provides a very stiff mechanical connection of the high-voltage and low-voltage sections 220, 230 and the housings 221, 231 thereof, so as to form the apparatus 210. The apparatus 210 is mounted on cushioning devices 212 in order to protect the processing system against vibrations. Furthermore, an outer housing 211, made of electrically conducting material (e.g., membrane or grid) kept at ground potential, may be present which surrounds the outer sides of at least the high-voltage section 220 (and its safety envelope 222) including the insulation device 240 and also, preferably, at least part of the low-voltage section 230. The apparatus 210 is mechanically suspended within the outer housing 211 by means of the mentioned cushioning devices 212.

The high-voltage supply setup 202, in the right-hand part of FIG. 1, comprises a number of high-voltage supply devices 250 which are configured for providing the electric voltage for the high-voltage section 220 of the apparatus 210. It is contained within by an electrically conducting outer housing 251 held at ground potential, and within it the individual supply devices 250 are mounted on a high-voltage rack within a common housing 252. The supply lines 253 run from the supply setup 202 to the apparatus assembly 201 through a bridge 203 realized as a double-wall conduit. The outer wall 261 of the bridge 203 is electrically conducting and kept at ground potential. The inner wall 262, which guides the supply lines along the bridge, is positioned within the outer wall 261; isolating spacers 263 serve to position the inner wall 262 at a distance to the outer wall 261. The bridge 203 is connected with the housing 211 and the envelope 222 via flexible connections which do not transfer vibrations, so as to avoid that vibrations are communicated to the tool setup. This also allows a sufficient amount of free motion between the assemblies 201 and 202 and thus facilitates the mechanical adjustment thereof.

The low-voltage supply setup 204 contains the supply devices 214 for electric supply and control of the components in the low-voltage section 231 arranged in a rack or outer housing 213 which may also be held at ground potential. The electric connections shown in FIG. 1 are only symbolic examples out of a larger number of electric lines leading to the apparatus. Additional electric connections are provided at various places at the section housings, in particular the low-voltage section housing (including voltage supplies for electrooptical components as well as electric supply and control lines for the target stage), but are not shown for better clarity of the drawings.

Insulation Device

Figure 3A:
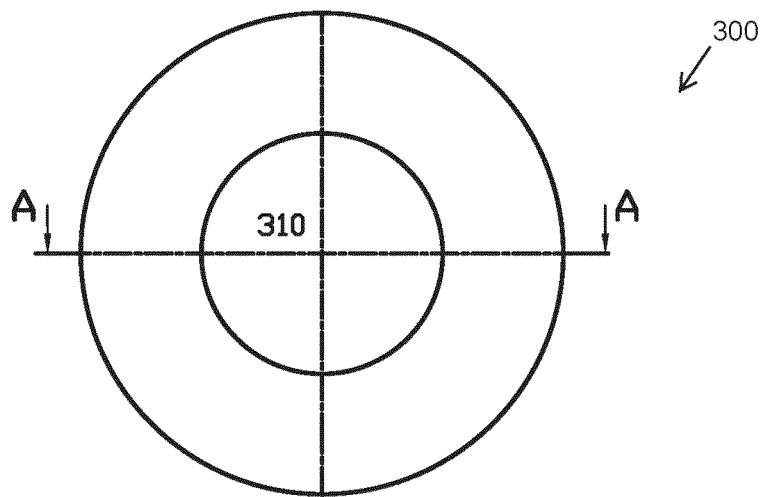
FIGS. 3A to 3C show the insulating device of the tool setup of FIG. 1 in a plan view, a longitudinal section and a cross section, respectively.
Figure 3B:
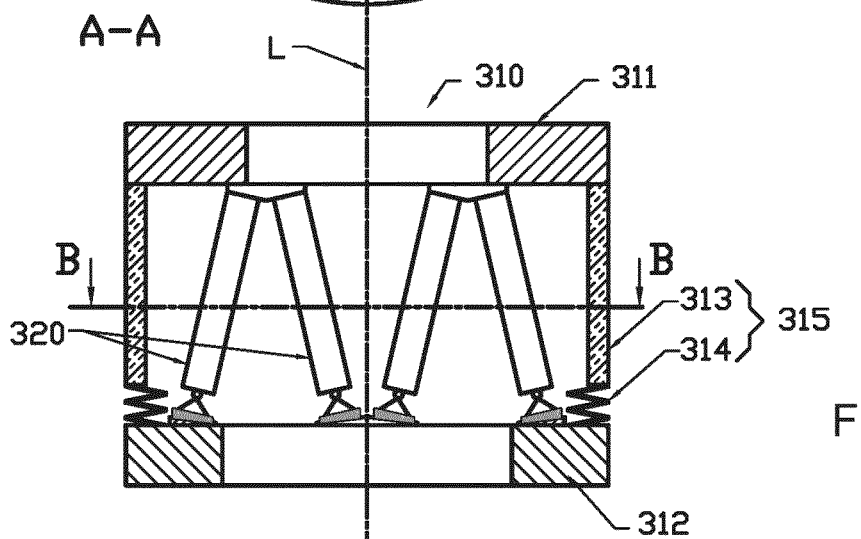
Figure 3C:
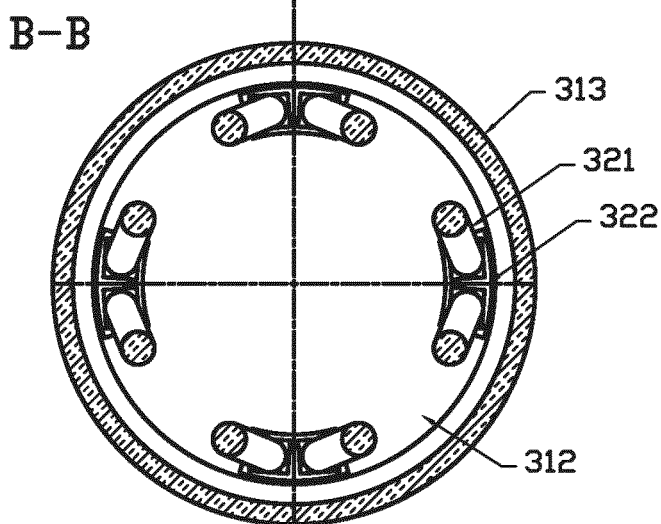

FIGS. 3A to 3C illustrate an insulator device 300 in accordance with embodiments of the invention, corresponding to the insulator device 240 of FIG. 1. FIG. 3A is a plan view, FIG. 3B shows a longitudinal sectional according to a section plane indicated as A-A of FIG. 3A, and FIG. 3C is a cross sectional view according to a horizontal section plane indicated as B-B of FIG. 3B.

The outer shape of the insulator device 300 is preferably tubular or cylindrical, having a longitudinal axis L, with a central passage 310 running along the longitudinal axis L. The space defined by the central passage 310 is configured to be held at high-vacuum conditions during operation. Two ring-shaped end plates 311, 312 form the top and bottom faces of the device, surrounding the central passage 310. The end plates 311, 312 serve as connection sides to the high-voltage and low-voltage housings 221 and 231 of the optical column, respectively. They may be made of a metallic material such as stainless steel or aluminum. The outer side of the device is constituted by a vacuum casing 315 of generally tubular shape, comprising an insulating ring 313 connecting the end plates 311, 312. The insulating ring 313 is suitably made of a insulating but vacuum-tight material such as a solid ceramic, e.g. aluminum oxide ($Al_2O_3$). In a preferred embodiment the ceramics may also be made of a ferrite material, or has elements of ferrite attached either on the inner or outer side (see FIG. 6); ferrite components may also be used in combination with non-magnetic ceramic material such as aluminum oxide. Ferrite material allows magnetic conductivity in combination with the property of electrical isolation, which is often advantageous with respect to the magnetic shielding efficiency along the vertical axis. Especially along the vertical axis, where the metallic housing of the upper and the lower column element has the largest opening (i.e. of the size of the insulator), magnetic field strengths can be significantly reduced, for instance by more than a factor of 10, by virtue of ferrite elements that are able to conduct the magnetic field lines away from the beam-optical axis.

A segment of the vacuum casing 315 is suitably realized as a bellows connection or membrane bellows 314, for instance at the place of connection of one of the end plates 311, 312 (in FIG. 3B, the lower plate 312) to the ring 313; this allows for relative positional adjustment between the upper and lower parts of the device 300 as required to accommodate dimensions variations which may occur within certain tolerances of manufacture as well as to allow relative repositioning during the adjustment of the pillars 320. It is worthwhile to note that the vacuum casing, and in particular the length-adjustable segment realized by the bellows component does not have to account for the mechanical support between the endplates 311, 312. The bellows connection may be, e.g., a conventional stainless-steel bellows tube. The longitudinal axis L corresponds to the center of FIGS. 3A and 3C, whereas it is the central line in FIG. 3A. The longitudinal axis will typically coincide with the optical axis of the optical column (FIG. 2), at least as regards the region where the device 300 is placed. A typical dimension of the device 300 is, for instance, about 600 mm diameter and 400 mm height, including the end plates 311, 312.

Between the end plates 311, 312 a number of pillars 320 is provided which provide the mechanical stability of the device 300. Preferably, the number of the pillars is six or eight, but in general any even number is possible, i.e. a number n=2 k with preferably k≥3; preferably the pillars are arranged in pairs. The pillars 320 are fixed at their ends to the end plates 311, 312 at a number of connection sites 322. The pillars of the embodiment shown are made of one piece, but as a variant within the invention they may be composed of two or more parts, joined together by suitable connections, preferably rigid connections. All pillars are made of a ceramic material of high mechanical strength, such as a sintered aluminum oxide ceramic, having a smooth surface. The ceramic components are produced employing processes of state of the art. In order to obtain their final shape and dimensions suitable known processes are used such as polishing. A smooth surface as obtained by polishing or like processes is, moreover, advantageous because it helps in avoiding local elevated electrostatic fields and charge effects.

While a good insulation between the two end plates is desired, it is often advantageous to allow for a very small "leakage" or draining current, which helps to discharge electrostatic charges which may collect at either side of the insulation, in particular at the high-voltage part, while keeping a stable voltage separation between the end plates 311 and 312. This will enhance the establishment of the voltages involved in a stable manner. Suitably the small draining current is below the µA range, typically in the range between approximately 0.1 to 100 nA (total current for all components). In order to achieve this small leak current the pillars may be provided with a small electric conductance. Such a conductance my be realized by selecting pillars with higher impurity or intentional dotation of the ceramics with suitable impurities that lower the otherwise high electrical resistance.

The pillars 320 preferably have uniform design, having cross sections of circular or any other suitable shape, and are arranged inclined with respect to the longitudinal axis. In this context, "inclined" is used to express that the direction of the main axis of the respective pillar 320 forms a non-zero angle (i.e., acute angle) with the direction of the longitudinal axis L. In a particularly advantageous configuration the pillars are arranged with alternating inclination, thus realizing a zig-zag structure wherein the pillars approximately realize the outer edges of an antiprisma. Thus, at each connection site 322 the ends of two pillars 320 converge and are fixed to the respective end plate. This zig-zag structure of pillars allows the adjustment of the end plate positions with regard to their mutual distance and angles (adjustment of position and orientation) in a simplified manner, by adjusting the effective length of the pillars.

Figure 5A:
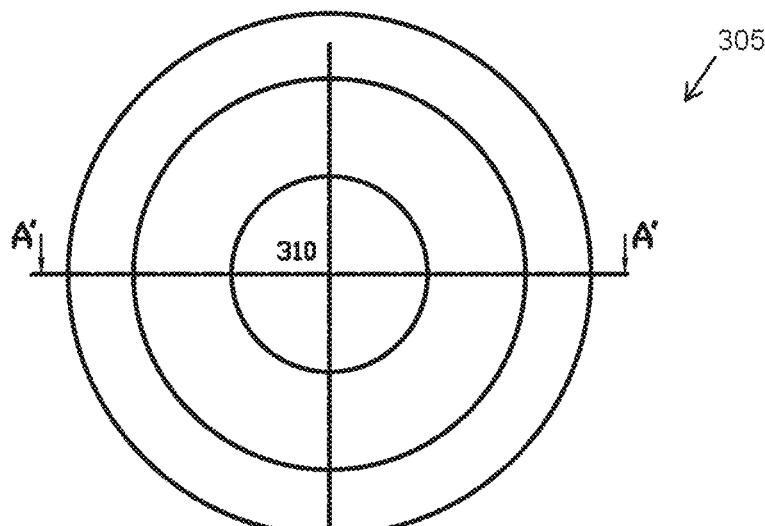
FIGS. 5A to 5C show a variant of the insulating device having additional ferrite insulators, in a plan view, a longitudinal section and a cross section, respectively.
Figure 5B:
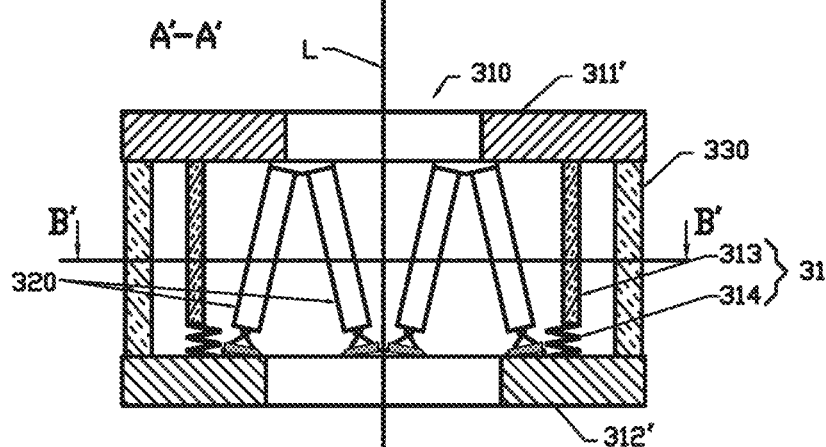
Figure 5C:
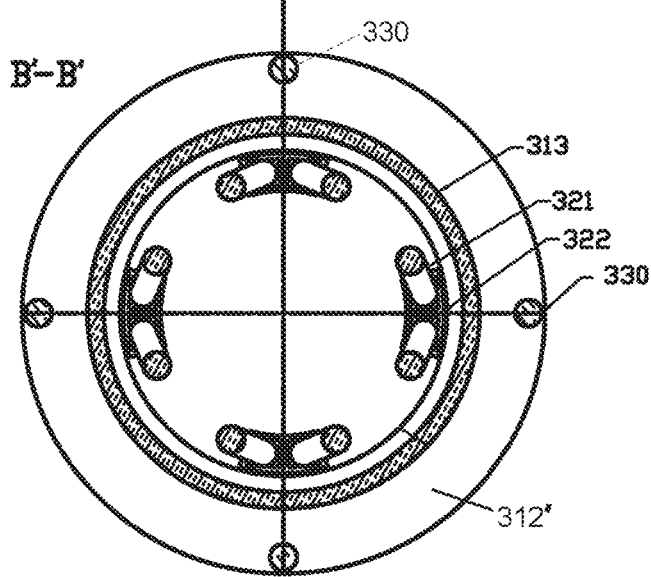

FIG. 4 shows a detail of the connection site of the lower end 321 of one pillar 320 to the bottom end plate 312. The connection site 322 is placed on an inclined end face 323 formed on the upper surface of the bottom end plate 312, one for each pillar end. Each end face includes an adjustable distance plate 324 and a joint 325 with a spherical bearing area. By means of these elements 324 the effective length of each pillar 320 can be adjusted at the connection sites 322. As can be seen in FIG. 4, the distance plate 324 may be realized, for instance, as a wedge-shaped element mounted on a flat support plate (not shown) attached to the end plate 311 (or, in a variant, 312) or directly to a flat face 323 of the end plate. The adjustable distance plate 324 is realized as a wedge plate made of a single piece having a center bore. The spherical-area joint 325 allows for the angular adaptation of the orientation of the pillar 320 when the effective length of the pillar is modified. The socket part of the joint 325 is fixed to the pillar end 321, which is connected to the end plate 312 by means of a bolt 326. The bolt 326 is arranged along a center bore of the components 323, 324, 325, which serves as clearance to allow for the (small) angular movements of the bolt during mounting. Once mounted, the bolt 326 clamps together the components of the connection site 322, so as to arrest the surface contacts in the joint 325 and in particular at the two surfaces of the distance plate 324 by frictional forces. The connection sites and the upper end of the pillars are constructed in a likewise manner, except that it is not required to provide distance plates, since it is sufficient to adjust the length of the pillars at the connection sites at the lower ends. The components of each connection site 322 can be made of any suitable material having the required mechanical strength and, preferably, a low thermal expansion (beside sufficient electric conductivity), such as Invar 36. FIGS. 5A to 5C (whose views correspond to those of FIGS. 3A to 3C) show a variant 305 of the insulator device, which also comprises a number of magnetic connection elements 330, which magnetically connect the upper and the lower plates 311', 312'. In the example shown, the magnetic connections elements 330 are realized as ferrite rods arranged vertically, i.e., parallel to the longitudinal axis, and preferably located outside the insulating ring 313. Since ferrite insulators generally will have a relatively low resistance, the cross section of the ferrite elements will suitably be chosen to only have a portion of the entire cross section of the alumina insulator, as is the case for the exemplary ferrite rods 330 positioned axially parallel to the insulator ring 313. The length of the rods 330 may be adjusted, for example, by providing inclined cuts in the rods 330 so as to produce wedge-shaped segments 331, as illustrated in FIG. 6. (Since the cuts do not incur a gap, they do not impair the magnetic connection generated with the ferrite rods 330.) Thus, the length of each rod can be adjusted by laterally displacing the wedge segments 331. In other respects, the construction of the insulator device 305 is equivalent to that of the device 300 shown in FIGS. 3A to 3C.

Mounting Procedure

The mounting and adjustment of the insulating device 300, 305 (FIGS. 3A-3C, 5A-5C), in particular with regard to the effective length of the pillars 320, may be carried out during or before the assembly of the housings 221, 231 into a casing system. One preferred method, wherein a prop device is used for assembling the insulating device before connecting the latter to the housings, is discussed below referring to FIGS. 7A and 7B. In another approach, the insulating device may first be joined with the housings and then the pillars are adjusted with respect to their length, using known measurement device for determining the actual position and orientation of the components and which adjustments are needed to compensate for deviations from the desired positions and orientations.

FIG. 7A shows a side view of the prop device 400 which is used in assembling the insulating device 300 (the procedure for the variant 305 is analogous) and adjusting the relative position between the bottom and top end plates of the insulating device. The prop device comprises a base part 401 and an upper support part 402, which are connected by means of three strut elements 403 arranged at 120° around the central axis. The strut elements are height-adjustable and are provided with flexible joints. The base part 401 and the upper support part 402 are provided with a central protruding parts 441, 442 shaped so as to match the central opening of the bottom and top end plates 312, 311, respectively. Thus, these two parts 401, 402 can support the bottom and top end plates 312, 311 at defined positions during the assembly and adjustment procedures. For the assembly, the bottom end plate 312 of the insulating device is placed on the base part 401, and the top end plate 311 on the upper support part 402 as shown in FIG. 7B. Then the relative position and angle of the end plates 311, 312 is adjusted so as to align them to each other according to the desired specifications, by tuning the position and angle of the strut elements 403; for determining the positions and orientations measurement devices of known type can be used. Once the end plates 311, 312 are in the desired position within the required tolerances, the pillars 320 are arranged into their final positions between the end plates. The connection sites 322 are fixed, inserting the wedge-shaped distance parts (FIG. 4) as needed to stably establish the correct lengths of the pillars as mechanical connection supports between the end plates. Finally, the prop device 400 is removed from the mounted insulating device 300, for instance by extracting it through the lower opening.

It will be clear that the invention is not restricted to the embodiment of the invention discussed above. Rather, many modifications and addition which are obvious to the skilled person are possible and will also be included under the scope of invention, within the limits of the appended claims.

What is claimed is:

1. A high-voltage insulation device for use in a charged-particle optical apparatus, comprising:
   a plurality of rigid pillars made of electrically insulating material, wherein said pillars are arranged around a central passage which traverses the insulation device along a longitudinal axis thereof, each pillar having two ends which are configured to be respectively fixed to two separate electrostatic housings of a charged-particle optical apparatus, and wherein said pillars are oriented at an inclined angle with regard to said longitudinal axis;

further comprising a vacuum housing of generally tubular shape and surrounding the pillars and the central passage, the vacuum housing comprising a length-adjustable segment.

2. The high-voltage insulation device of claim 1, wherein the pillars are provided with adjustment means allowing mechanical adjustment of an effective length of the pillars.

3. The high-voltage insulation device of claim 1, wherein the pillars are arranged around the longitudinal axis and in a configuration of alternating angles of tilt with regard to the longitudinal axis.

4. The high-voltage insulation device of claim 1, configured to be positioned within a high-vacuum space dedicated to an electro-optical column oriented along the central opening of the high-voltage insulation device.

5. The high-voltage insulation device of claim 1, wherein the length-adjustable segment is a bellows segment.

6. The high-voltage insulation device of claim 1, wherein each pillar is oriented to the longitudinal axis in a skew line arrangement at an angle of tilt, with the ends of each pillar located at a greater distance to the longitudinal axis than a central portion of the pillar.

7. The high-voltage insulation device of claim 1, wherein at least one end of each pillar is provided with an adjustable jack for adjusting a length of the respective pillar and with a joint allowing for a correction of an angle of tilt of the pillar with respect to the longitudinal axis.

8. The high-voltage insulation device of claim 1, wherein the pillars are arranged around the central passage at regular angular intervals and the number of the pillars is even.

9. The high-voltage insulation device of claim 8, wherein the pillars are arranged in pairs.

10. The high-voltage insulation device of claim 1, wherein the pillars are made of one piece.

11. The high-voltage insulation device of claim 1, further comprising a first end plate and a second end plate, the first and second end plates each having a central opening, the central passage running between the central openings of the first and second end plates wherein each pillar is arranged outside the central passage and is fixed at a first end thereof at the first end plate and at a second end thereof at the second end plate.

12. The high-voltage insulation device of claim 11, further comprising magnetic connection elements comprising a material of high magnetic susceptibility, said elements being arranged between the first and second end plates for obtaining a magnetic connection therebetween.

13. The high-voltage insulation device of claim 11, wherein the first and second end plates are realized as planar plates oriented parallel to each other and having the same overall circular cylindrical shape around the longitudinal axis, the respective central openings being circular and centered around the longitudinal axis.

14. A charged-particle optical apparatus, comprising:
an electro-optical column and at least two electrostatic housings, said electrostatic housings surrounding respective sections of the electro-optical column and configured for being applied different electrostatic potentials;
a high-voltage insulation device, itself comprising:
a first end plate and a second end plate, each having a central opening, wherein the central openings define a central passageway;
a plurality of rigid pillars made of electrically insulating material,
wherein said pillars are arranged around the central passage which traverses the insulation device along a longitudinal axis thereof, each pillar having two ends which are configured to be respectively fixed to two separate electrostatic housings of a charged-particle optical apparatus, and
wherein said pillars are oriented at an inclined angle with regard to said longitudinal axis;
wherein said high-voltage insulation device connects one of the electrostatic housings with the other of the electrostatic housings, wherein said electrostatic housings comprise openings configured to be combined with the central openings of the high-voltage insulation device so as to form a channel for the electro-optical column;
further comprising a vacuum housing of generally tubular shape and surrounding the pillars and the central passage, the vacuum housing comprising a length-adjustable segment.

15. The apparatus of claim 14, wherein the electro-optical column is contained within a high-vacuum space, the pillars being positioned within said high-vacuum space.

16. The apparatus of claim 14, comprising a vacuum casing connecting the first and second end plates and surrounding the plurality of pillars, said vacuum casing comprising a vacuum-tight insulating ring of tubular shape arranged between the first and second end plates.

* * * * *